(12) United States Patent
Prohofsky et al.

(10) Patent No.: US 9,263,158 B2
(45) Date of Patent: Feb. 16, 2016

(54) DETERMINING DATA RETENTION TIME IN A SOLID-STATE NON-VOLATILE MEMORY

(71) Applicant: Seagate Technology LLC, Cupertino, CA (US)

(72) Inventors: Thomas R. Prohofsky, Edina, MN (US); Darren E. Johnston, Burnsville, MN (US)

(73) Assignee: Seagate Technology LLC, Cupertino, CA (US)

( * ) Notice: Subject to any disclaimer, the term of this patent is extended or adjusted under 35 U.S.C. 154(b) by 8 days.

(21) Appl. No.: 13/969,049

(22) Filed: Aug. 16, 2013

(65) Prior Publication Data

US 2015/0052416 A1    Feb. 19, 2015

(51) Int. Cl.
| G11C 29/50 | (2006.01) |
| G06F 11/10 | (2006.01) |
| G11C 16/34 | (2006.01) |
| H03M 13/05 | (2006.01) |
| H03M 13/11 | (2006.01) |
| H03M 13/15 | (2006.01) |

(52) U.S. Cl.
CPC ...... *G11C 29/50016* (2013.01); *G06F 11/1048* (2013.01); *G11C 16/3418* (2013.01); *G11C 29/50004* (2013.01); *H03M 13/05* (2013.01); *H03M 13/1102* (2013.01); *H03M 13/1515* (2013.01)

(58) Field of Classification Search
CPC .......... G11C 16/3418; G11C 16/3431; G11C 29/50016
See application file for complete search history.

(56) References Cited

U.S. PATENT DOCUMENTS

| 6,141,280 | A | * | 10/2000 | Cho | 365/222 |
| 6,603,694 | B1 | * | 8/2003 | Frankowsky et al. | 365/222 |
| 7,859,932 | B2 | | 12/2010 | Mokhlesi | |
| 8,074,011 | B2 | | 12/2011 | Flynn et al. | |
| 8,098,537 | B2 | | 1/2012 | Mokhlesi | |
| 8,370,712 | B2 | | 2/2013 | Eleftheriou et al. | |
| 8,400,859 | B2 | * | 3/2013 | Pelley et al. | 365/222 |
| 8,612,669 | B1 | * | 12/2013 | Syu et al. | 711/103 |
| 8,645,776 | B2 | * | 2/2014 | Byom et al. | 714/723 |
| 8,650,353 | B2 | * | 2/2014 | Belgal et al. | 711/103 |
| 2004/0027900 | A1 | * | 2/2004 | Lee | 365/222 |
| 2005/0243626 | A1 | * | 11/2005 | Ronen | 365/222 |
| 2007/0258306 | A1 | * | 11/2007 | Riekels et al. | 365/222 |
| 2009/0161466 | A1 | * | 6/2009 | Hamilton et al. | 365/222 |

(Continued)

OTHER PUBLICATIONS

Yu Cai; Yalcin, G.; Mutlu, O.; Haratsch, E.F.; Cristal, A.; Unsal, O.S.; Ken Mai, "Flash correct-and-refresh: Retention-aware error management for increased flash memory lifetime," Computer Design (ICCD), 2012 IEEE 30th International Conference on , vol., No., pp. 94,101, Sep. 30, 2012-Oct. 3, 2012.*

*Primary Examiner* — Steve Nguyen
(74) *Attorney, Agent, or Firm* — Hall Estill Attorneys at Law (57) ABSTRACT

Method and apparatus for managing data in a memory, such as a flash memory array. In accordance with some embodiments, a test pattern is written to a selected block of solid-state non-volatile memory cells. The test pattern is read from the selected block and a total number of read errors is identified. A data retention time is determined in response to the total number of read errors and an elapsed time interval between the writing of the test pattern and the reading of the test pattern. Data in a second block of the solid-state non-volatile memory cells are thereafter refreshed in relation to the determined data retention time.

20 Claims, 5 Drawing Sheets

(56) References Cited

U.S. PATENT DOCUMENTS

2010/0058018 A1* 3/2010 Kund et al. .................. 711/167
2010/0157671 A1* 6/2010 Mokhlesi ................ 365/185.03
2010/0169726 A1* 7/2010 Kasuga et al. ............... 714/719
2010/0313084 A1* 12/2010 Hida et al. ................... 714/704
2012/0198312 A1* 8/2012 Kankani et al. .............. 714/768
2014/0006688 A1* 1/2014 Yu et al. ...................... 711/103

* cited by examiner

DETERMINING DATA RETENTION TIME IN A SOLID-STATE NON-VOLATILE MEMORY

SUMMARY

Various embodiments of the present disclosure are generally directed to the management of data in a memory by monitoring actual data retention rates for data stored in selected blocks of the memory, such as in a flash memory array.

In accordance with some embodiments, a test pattern is written to a selected block of solid-state non-volatile memory cells. The test pattern is read from the selected block and a total number of read errors is identified. A data retention time is determined in response to the total number of read errors and an elapsed time interval between the writing of the test pattern and the reading of the test pattern. Data in a second block of the solid-state non-volatile memory cells are thereafter refreshed in relation to the determined data retention time.

These and other features which may characterize various embodiments can be understood in view of the following detailed discussion and the accompanying drawings.

DETAILED DESCRIPTION

The present disclosure generally relates to managing data stored in a memory module, such as but not limited to a flash memory array of a data storage device.

A wide variety of non-volatile data storage memories are known in the art. Some non-volatile memories take the form of solid-state memory cells, such as flash memory, resistive random access memory (RRAM), spin-torque transfer random access memory (STRAM), phase change random access memory (PCRAM), etc.

These and other types of memory cells take a semiconductor construction and store data in relation to programmed electrical, mechanical and/or structural aspects of the cells. A variety of real world effects such as read disturb, write disturb, charge drift, temperature degradation, demagnetization, accumulated write/erasure cycles, wear, etc. can affect the programmed integrity of a cell over time. A retention rate for a memory cell (or group of cells) can be characterized as a rate at which the cell(s) lose the continued ability to retain data.

While solid-state non-volatile memories may be specified to retain data for a selected period of time (e.g., five years, etc.), as a memory nears the end of its operational life, the memory may have a significantly degraded retention rate (e.g., three months, etc.). Memory controllers can take proactive steps to mitigate such reductions in memory performance. For example, if a block of memory exhibits a relatively high number of correctable errors during readback operations, the block of memory may be retired from service (deallocated) before the block degrades to the point where it provides uncorrectable errors with continued use. Such proactive management is only available while the device remains powered, however; turning off the device for an extended period of time may prevent the controller from operating in the background to maintain data integrity, and thus runs a risk that stored data may not be available when the device is reactivated.

Accordingly, various embodiments of the present disclosure are generally directed to an apparatus and method for managing data in a solid-state memory. As explained below, the memory includes an array of solid-state non-volatile memory cells. An evaluation circuit is adapted to write a test pattern to a control set of the memory cells in the array. The evaluation circuit periodically reads the test pattern from the control set and determines a number of read errors. A data retention time (rate) is generated based on the read errors, and a data retention policy for a second set of memory cells in the array is thereafter implemented based on the calculated data retention rate. The data retention rate may be communicated to a host device to enable host level actions to be carried out to ensure data integrity.

Parametric test log data such as the number and types of errors, temperature measurements, etc. may be accumulated in conjunction with the repetitive reading of the test pattern. The data retention rate may thereafter be extrapolated for different operational conditions (e.g., higher temperatures, lower temperatures, etc.).

In accordance with some embodiments, a test protocol is carried out that includes the following operations:

1. Blocks of memory not currently assigned for the storage of user data are set aside from one or more media devices to be used as a control set.
2. A data pattern is written to the control set and the time of writing is recorded.
3. The control set is periodically read and temperature is optionally logged.
4. Once the data cannot be completely recovered using various hardware and/or software reconstruction algorithms, a second time stamp is logged and the delta between the write time and the uncorrectable error time is available as a measure of the current retention time for the memory.
5. The current retention time can be logged, reported and/or compared to a threshold for early warning notification and other corrective actions. The temperature profile can be used to more accurately estimate retention time at a given non-operating temperature.

6. The control set of memory is returned to the allocation pool of available storage blocks.

In further embodiments, the foregoing protocol can be modified in a variety of ways, including the following:
1. The number of blocks and the media involved can be adjusted based on a variety of factors, including blocks at different locations within a memory die.
2. The frequency of periodic reading can be adjusted based on data I/O performance and other factors.
3. The number and types of active control sets can be maintained concurrently for improved resolution and trend analysis.
4. The test pattern can be maintained in local memory and compared using an exclusive or (XOR) or other function to calculate actual errors with great precision irrespective of total number of errors (e.g., beyond what is normally the "uncorrectable" threshold).
5. The data patterns can vary based on block locations and other parameters.

In this way, real time assessments of data retention rates can be calculated for a memory device using a relatively small amount of overhead memory dedicated to this purpose. The technique has particular value in a high data turn environment (e.g., where every memory cell in the device is written, garbage collected and returned to service) on a highly frequent basis (e.g. once a day, once a week, etc.). Thus, high I/O rates may mask the actual data retention rates. By periodically rotating the control set, actual retention rate data can be obtained on a per location basis.

Figure 1:
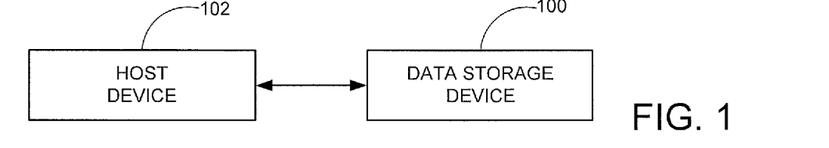
FIG. 1 provides a functional block representation of a data storage device arranged to communicate with a host device in accordance with various embodiments.

These and other features of various embodiments can be understood beginning with a review of FIG. 1, which provides a simplified block diagram of a data handling system featuring a data storage device 100 coupled to a host device 102. The respective storage device 100 and host 102 can take any suitable form. In some embodiments, the host 102 is a network accessible computing device, such as a desktop computer, a server, a portable electronic device, a smart phone, laptop, tablet, a gaming system, etc. The storage device 100 may be incorporated into the host 102, or may be connected to the host locally or via a network to provide volatile and/or non-volatile memory data storage capabilities for the host 102.

Figure 2:
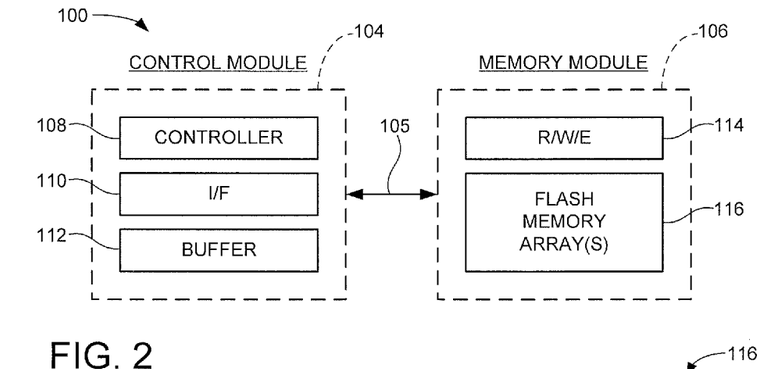
FIG. 2 shows a block diagram representation of the data storage device of FIG. 1 in accordance with some embodiments.

FIG. 2 illustrates an exemplary construction for the storage device 102 of FIG. 1 in accordance with some embodiments. The device 102 includes a control module 104 and a memory module 106. The control module 104 provides top level control for the data handling system, and the memory module 106 provides a main data store. The memory module 106 is adapted to receive, process and execute commands issued to it by the control module 104 across a control/memory module communication interface 105.

The respective modules 104, 106 may take a number of forms. A solid-state drive (SSD) application may incorporate both the control module 104 and the memory module 106 in an integrated, stand-alone assembly. In a hybrid disc drive application, the memory module 106 may include both flash and disc-based memory. A memory card application may incorporate some or all of the control module functionality in the host device 102 (FIG. 1).

The exemplary control module 104 in FIG. 2 is shown to include a controller 108, an interface (I/F) circuit 110 and a memory buffer 112. The controller 108 provides overall control functions for the device 100, including directing transfers of data between the host 102 and the memory module 106. The I/F circuit 108 provides interface communications with the host and with the memory module 106. The buffer 112 can provide a storage location for programming and control data used by the controller 108 as well as temporary storage of data during data access operations. Although not specifically depicted in FIG. 2, the control module 104 may include additional functionality as well, including encryption, error detection and correction, and other signal processing capabilities.

The memory module 106 is shown to include a read/write/erase (R/W/E) circuit 114 and one or more flash memory arrays 116. The R/W/E circuitry 114 operates to perform read, write and erasure functions upon the flash memory arrays 116 responsive to control inputs from the control module 104. While the memory utilizes flash memory, such is merely exemplary and not limiting as any number of different types of solid-state non-volatile memory can be used, including hybrid systems with multiple types of memory (e.g., flash, RRAM, STRAM, PCRAM, etc.).

Figure 3:
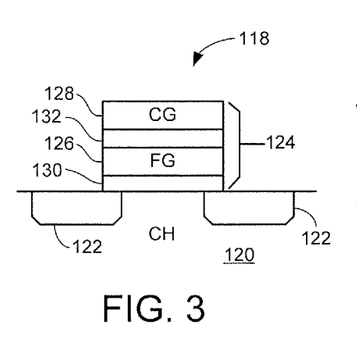
FIG. 3 shows a flash memory cell construction that can be used in the device of FIG. 1.

The flash memory arrays 116 may be formed of individual flash memory cells 118, as generally depicted in FIG. 3. The flash memory cell 118 is formed on a semiconductor substrate 120 having spaced apart n+ doped regions 122. A gate structure 124 spans the pair of adjacent doped regions so that the flash cell takes a general nMOS transistor configuration. Additional flash cells can be formed on the substrate so that each adjacent pair of the doped regions 122 is provided with an associated gate structure 124.

The gate structure 124 provides an alternating stack of electrically conductive gates 126, 128 and electrically insulative regions 130, 132. Data are stored by each cell 118 in relation to the relative amount of electrical charge stored on the lower gate 126, which is characterized as a floating gate (FG).

The floating gate 126 accumulates charge during a programming operation by the selected application of appropriate voltages to the adjacent doped (drain and source) regions 122 and the upper gate 128, which is characterized as a control gate (CG). These applied voltages induce the controlled migration of electrical charge from a channel (CH) portion of the semiconductor substrate 120 to the floating gate 126 across insulative region 130.

In an initial erased state, there will usually be substantially no accumulated charge on the floating gate. In this state, the cell will generally tend to exhibit drain-source conductivity across the channel without the application of voltage to the control gate. Once charge has been accumulated on the floating gate, the drain-source path will be non-conductive unless a sufficiently high gate control voltage is applied to the control gate, at which point the cell becomes conductive. The programmed state of the cell can be determined by observing the level of control gate voltage required to allow drain-source current to pass through the cell, which generally correlates to the amount of accumulated charge on the floating gate.

The cell 118 can be configured as a single-level cell (SLC) or a multi-level cell (MLC). An SLC stores a single bit; a normal convention is to assign the logical bit value of 1 to an erased cell (substantially no accumulated charge) and a logical bit value of 0 to a programmed cell (presence of a selected threshold of accumulated charge). An MLC stores multiple bits, such as two bits. Generally, n bits can be stored using $2^n$ storage states. A normal convention is to assign the multi-bit logical value 11 to an erased cell with charge C0 (substantially no accumulated charge), and then sequentially assign the remaining multi-bit logical values 01, 00 and 10 to increasingly higher charge levels C1, C2 and C3.

A special erasure operation is generally required to remove accumulated charge from the floating gate 126. An erasure can be carried by the application of a relatively high voltage to the control gate to cause migration of the charge from the floating gate back to the channel. A different set of voltages may be applied to the cell to thereafter add charge to the floating gate during a data write operation.

Figure 4:
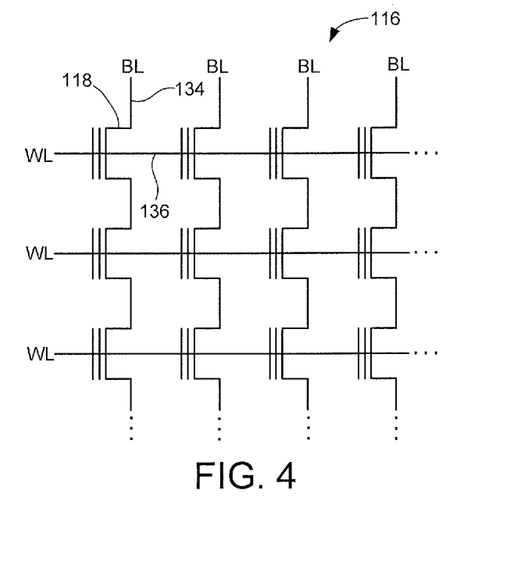
FIG. 4 is a schematic depiction of a portion of a flash memory array using the cells of FIG. 3.

Memory cells such as 118 in FIG. 3 can be arranged in the memory module 106 as an array of rows and columns of memory cells, as generally depicted in FIG. 4. Each column of adjacent cells can be coupled via one or more bit lines (BL) 134. The control gates 128 of the cells 118 along each row can be interconnected via individual word lines (WL) 136.

Figure 5:
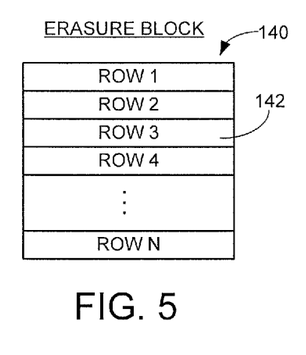
FIG. 5 illustrates an exemplary format for an erasure block.
Figure 6:
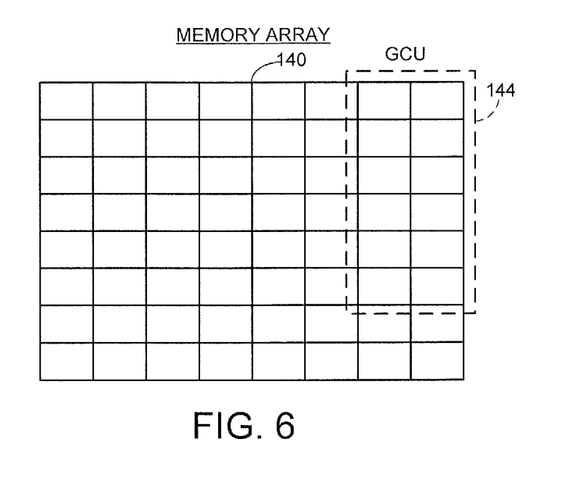
FIG. 6 shows an arrangement of erasure blocks into a garbage collection unit (GCU).

The array of memory cells shown in FIG. 4 may be grouped into erasure blocks 140, as depicted in FIGS. 5 and 6. Each erasure block 140 may be a separately addressable block of memory and represents the smallest unit of memory that can be concurrent erased at a time. Each erasure block 140 may be arranged as a plurality of rows 142 of memory cells, with each row sharing a common word line (FIG. 4) and accommodating the storage of a selected amount of user data. Other internal arrangements and interconnections of cells can be utilized as desired.

Block-level wear leveling may be employed to track the erase and write status of the various blocks 140. New blocks will be allocated for use as required to accommodate newly received data. In some embodiments, groups of blocks 140 may be accumulated into larger garbage collection units (GCUs) 144 which are allocated, used and erased as a unit. GCUs 144 may take any suitable size.

In at least some embodiments, a fixed size set of data, sometimes referred to as a page, is written to each row 142 at a time. The page size may correspond to a logical sector, or multiple user sectors may be incorporated into each page's worth of data. The sectors may each have an associated logical address, such as a logical block address (LBA). Error correction codes such as parity bits or Reed Solomon codes may be incorporated at the page level to correct errors as a full page worth of data is retrieved. Metadata and other control information may be stored in each erasure block 140, or stored elsewhere such as in specific blocks dedicated to this purpose.

Figure 7:
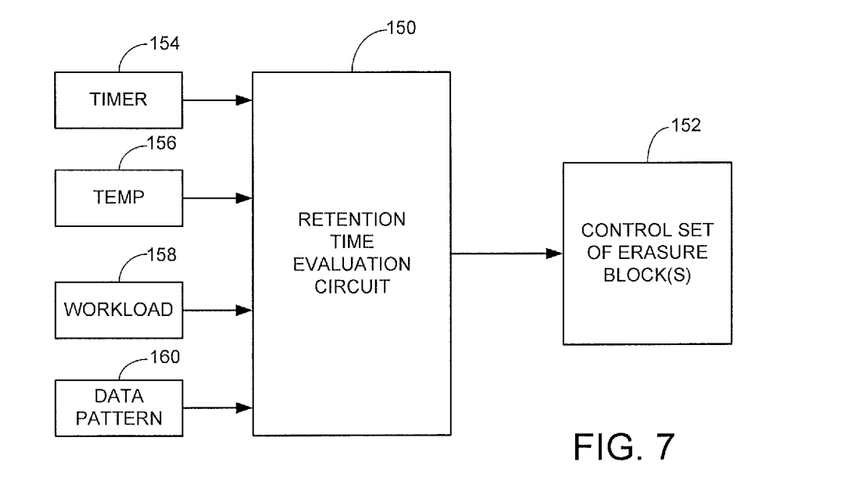
FIG. 7 is a retention time evaluation circuit operative in accordance with various embodiments to evaluate retention times of erasure blocks from FIG. 6.

FIG. 7 is a functional block representation of a retention time evaluation circuit 150 constructed and operated in accordance with various embodiments. The evaluation circuit 150 can be incorporated as an operational routine of the controller 108 (FIG. 2), part of the R/W/E circuit 114, or can be a separate hardware/software/firmware based circuit in the control module 104 or the memory module 106.

As explained below, the evaluation circuit 150 operates to assess retention times for the flash memory array(s) 116. This is carried out by selecting a control set of erasure blocks 152 (hereinafter "control set" or "control blocks") for relatively long term evaluation of data retention characteristics of the blocks. The control blocks 152 may form a selected GCU 144 (FIG. 6) that is temporarily removed from the available allocation pool. The duration of the testing can vary, but it is contemplated that such testing will be on the order of a few days/weeks/months and therefore significantly shorter than the overall operational life of the memory.

The evaluation circuit 150 receives a variety of inputs from other operational aspects of the device 102, including timing signals from a timer 154, temperature measurements from a temperature circuit 156, a workload indication from a workload monitoring block 158 and a data (test) pattern from data pattern source 160. These various circuits can be incorporated into various other portions of the device 102, such as the I/F circuit 110, the R/W/E circuit 114, the array 116, etc.

Once a test pattern is written to the selected control blocks 152, the evaluation circuit 150 periodically reads back a copy of the written pattern (either directly or via the R/W/E circuit 114) and determines an error rate. Once a selected number of errors has been identified, the evaluation circuit 150 generates a current data retention time, and uses the retention time to adjust (as required) a data retention policy for the device 102.

Figure 8:
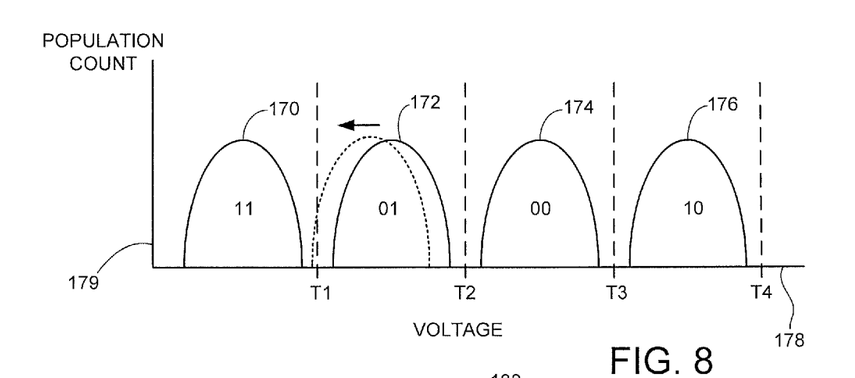
FIG. 8 illustrates charge density populations for memory cells from FIG. 6.

In order to better understand operational aspects of the evaluation circuit 150, FIG. 8 has been provided to illustrate one manner in which data may be stored in the various flash memory cells 118 that make up the erasure blocks 140/GCUs 144. More particularly, FIG. 8 illustrates exemplary normalized charge distributions 170, 172, 174 and 176 for different levels of charge stored on the various flash memory cells 118 in the array of FIG. 6.

The distributions are plotted against a common x-axis 178 indicative of voltage magnitude and a common y-axis 180 indicative of cell population count.

The distributions 170, 172, 174 and 176 represent variations about nominal accumulated charge states $C0<C1<C2<C3$, and correspond to MLC programmed states 11, 01, 00 and 10. Other encoding schemes can be used. Distribution 170 represents variation in the amount of charge on the memory cells in the array that have been programmed to the state 11, distribution 172 corresponds to state 01, distribution 174 corresponds to state 00, and distribution 176 corresponds to state 10. The cells in population 176 have the most accumulated charge and the cells in population 170 have the least accumulated charge.

The programmed states 11, 01, 00 and 10 may represent data for two different pages (blocks) of data in each cell. In this case, the least significant bit (LSB) of the programmed state may provide a bit value for a first page, and the most significant bit (MSB) of the programmed state may provide a bit value for a second page.

The respective charge distributions 170-176 are ideally non-overlapping to allow the application of suitable read-threshold voltages T1, T2, T3 and T4 to differentiate between the various programmed states. Threshold T1 nominally provides a voltage level sufficient to place all of the memory cells in distribution 170 into a source-drain conductive state, but insufficient to place the cells in distributions 172, 174 and 176 into a conductive state. The threshold T4 is generally large enough to place all of the cells in a conductive state irrespective of their programmed state.

The programmed state of a selected flash memory cell can be read by placing the bit line 134 (FIG. 4) for the selected cell at a suitable forward voltage (e.g., +3V, etc.), and placing the remaining non-selected bit lines at some other lower reference voltage (e.g., 0V). The non-selected word lines 136 for rows not containing the selected cell can be placed at the highest threshold T4, so that all of the cells in the selected column other than the selected cell are placed in a source-drain conductive state.

One or more read-threshold voltages can be thereafter applied to the WL 136 associated with the selected cell, and the programmed state of the selected cell can be determined in relation to whether current flows through the bit line 134 and the other cells in the selected column. The read operation thus assesses whether a given read-threshold voltage is sufficient to place the selected cell in a conductive state; the higher the applied voltage required to obtain current flow through the column, the higher amount of accumulated charge is present on the floating gate.

In some embodiments, a first page of data is written to the cells along a selected row of cells in SLC mode. The first page of data will constitute a bit sequence of logical 0s and 1s in some order (e.g., 00101111010000100 . . . ). One bit will be stored in each cell. Those cells in which a logical 1 is to be stored may receive no programming effort (or minimal programming effort) so as to have a charge level that falls within the "11" distribution 170. Those cells in which a logical 0 is to be stored will receive sufficient programming effort to raise the charge level to fall within the "00" distribution 174.

To read back the stored bit sequence from the SLCs, the read threshold voltage T2 can be applied to each cell in turn, and the stored state (logical 1 or 0) can be determined in relation to whether the cell is placed into a conductive state as a result of the applied read threshold voltage.

A second page of data may be subsequently overwritten to the SLC cells to convert the cells into MLC form. As before, the second page of data will constitute a bit sequence of logical 0s and 1s, and one bit from the second page of data will be stored to each cell. Those cells to which a logical 1 is to be stored will receive no additional programmed effort. Those cells to which a logical 0 is to be stored will receive sufficient additional charge to increment the charge level to the next higher distribution.

If a logical 1 is to be written to a memory cell programmed in the "11" distribution 170, the additional charge will transition the cell to the "01" distribution 172. Similarly, if a logical 1 is to be written to a memory cell programmed in the "00" distribution 174, the additional charge will transition the cell to the "10" distribution 156. In each case, the LSB of the programmed cell (rightmost bit) indicates the bit value for the first page of data and the MSB of the programmed cell (leftmost bit) indicates the bit value for the second page of data.

Ideally, the respective populations 170-176 maintain sufficient separation to enable the various thresholds T1-T4 to correctly discern the programmed states of the cells. However, over time a variety of effects such as wear, read disturb, write disturb, temperature, charge drift, manufacturing tolerances, etc. can cause cells within a given population to drift, such as depicted by the dotted line shifted representation of population 152 in FIG. 8. It can be seen that some of the memory cells in the shifted population 152 will be detected as storing the programmed state 11 rather than the actual programmed state 01. Charge drift can result in increases or decreases in the total amount of accumulated charge, so that a population shift to the right in FIG. 8 can occur as well.

Figure 9:
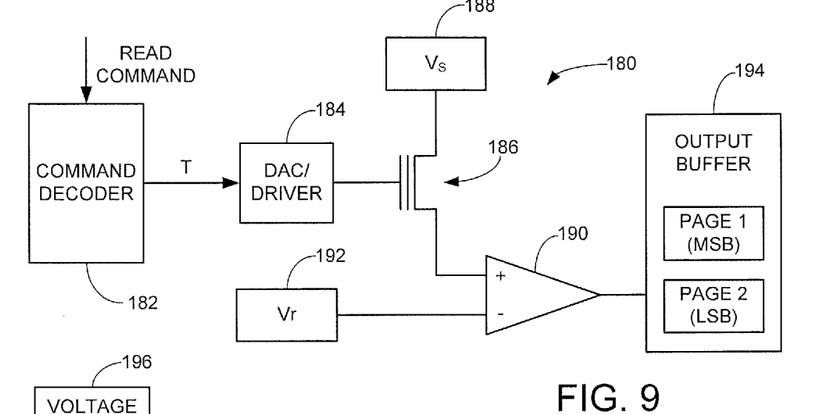
FIG. 9 is a read portion of a read/write/erasure circuit.

FIG. 9 illustrates a read circuit 180 of the read/write/erasure circuitry 114 of FIG. 2 operable to read two pages (blocks) of data from a group of MLCs, such as along a selected row. A command decoder block 182 processes a read command and outputs one or more digital read threshold values T to a digital-to-analog (DAC)/driver circuit 184. The DAC/driver 184 outputs a corresponding analog gate voltage to each cell in turn (represented by a single cell 186). A source voltage $V_s$ is applied by source 188. The conductive state of the cell is sensed using a comparator 190 and a suitable reference voltage Vr from source 192. The sensed data are provided to an output buffer 194 which separately stores the stored data (Page 1 and Page 2, respectively).

Multiple thresholds may be required to sense the storage state of each cell. The voltage threshold T2 can be initially applied to sense the storage state of the MSB Page 1 data. The voltage thresholds T1 and T3 may be subsequently applied to sense the storage state of the LSB Page 2 data. If the threshold T2 rendered the cell conductive, T1 may be subsequently applied to determine whether the cell falls within populations 170 or 172. Similarly, if the threshold T2 failed to place the cell in a conductive state, application of T3 will determine whether the cell falls within populations 174 or 176.

The storage state 11, 01, 00 or 10 can thus be easily determined, with the first (MSB) bit indicating a bit in the first page and the second (LSB) bit indicating a bit in the second page. Repeating the above steps for each MLC in turn will produce the recovered bit sequences for the first and second pages.

Figure 10:
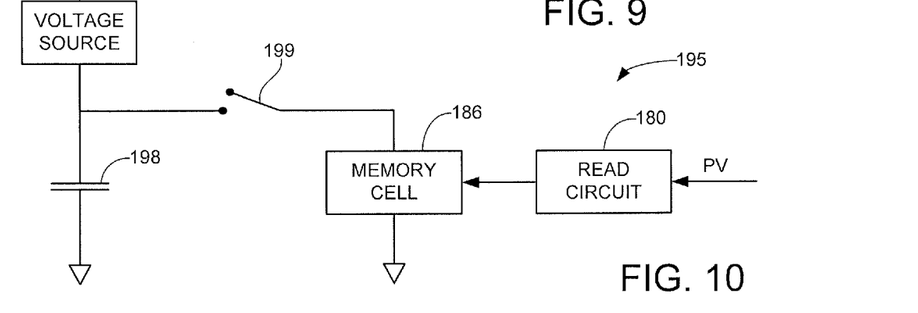
FIG. 10 is a write portion of a read/write/erasure circuit.

Programming of the cells can be carried out in FIG. 10 using a write circuit 195 of the read/write/erasure circuitry 114. A charge pump arrangement can be used whereby discrete quanta of accumulated charge are sequentially transferred to the selected cell 186 to raise the total accumulated amount of charge to the desired programming distribution in FIG. 8.

A voltage source 196 supplies a programming voltage to a capacitor 198 or other charge storage element. A selectively activated switch 199, which may take the form of a power MOSFET or other suitable device, periodically closes to allow the transfer of the accumulated charge from the capacitor 198 to the selected memory cell 186.

The read circuit 180 from FIG. 8 is used to periodically apply one of several program verify (PV) read threshold voltages to the cell during the accumulation of charge. In some embodiments, the program processing of FIG. 10 continues until the cell 186 no longer becomes conductive responsive to the specified PV read threshold value, at which point the programming operation on the selected cell is terminated.

Figure 11:
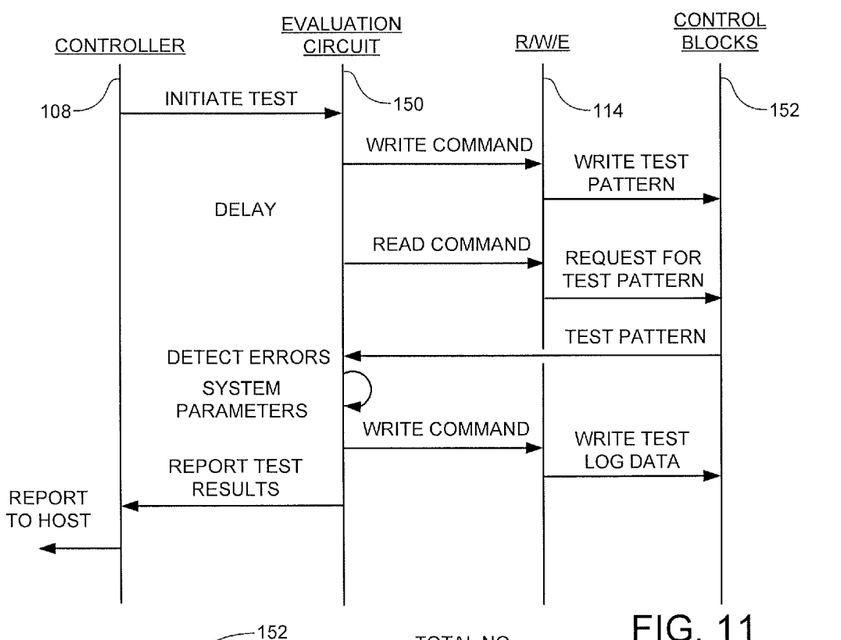
FIG. 11 is a timing sequence to show steps carried out by the evaluation circuit of FIG. 7 in accordance with some embodiments.

FIG. 11 provides a timing sequence to illustrate steps carried out by the various circuits of FIGS. 7-10 in accordance with some embodiments to determine a current data retention time. The controller 108 provides a command to the evaluation circuit 150 to initiate a retention rate test. The evaluation circuit 150 selects the control blocks for the test and issues a write command with an associated test pattern to the R/W/E circuit 114, which writes the test pattern to the selected control blocks 152. The test pattern can take any suitable form, including a repeating pattern (e.g., a 2T pattern), a random pattern, a preselected test pattern, etc. Error correction codes (ECC) may be written that enable detection and correction of up to a selected number of errors in the recovered sequence.

After a suitable delay (e.g., 30 minutes, 24 hours, 3 days, etc.), the evaluation circuit 150 issues a read command to the R/W/E circuit 114, which operates to recover a copy of the test pattern and return it to the evaluation circuit. In some embodiments, the R/W/E circuit 114 applies ECC processing to detect and correct errors in the recovered sequence, and reports the total number(s) of detected and corrected errors to the evaluation circuit 150. In other embodiments, the R/W/E circuit 114 passes the recovered sequence without the application of ECC processing, and the evaluation circuit 150 performs a comparison (e.g., XOR, etc.) with an existing copy of the original test pattern to identify errors in the readback sequence.

The evaluation circuit 150 may further obtain associated system parameters at this time, such as current temperature values, a time/date stamp, the total numbers of detected errors, etc. As desired, a write command is issued to write this information as a test log data entry to the control blocks 152. The data may also be shared with the controller 108, which in turn may provide a report to the host device 102 (FIG. 1). It is contemplated that the read command and log update operations may be repeated a number of times until a predetermined number of errors is reached.

Figure 12:
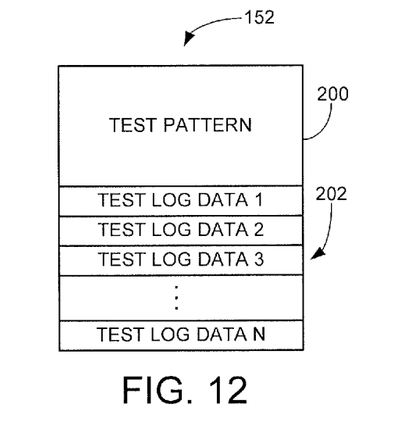
FIG. 12 depicts a control portion of the memory.

FIG. 12 depicts a format for the control blocks 152 in accordance with some embodiments. The test pattern may occupy a first portion 200 of the memory capacity of the control blocks 152, and test log data entries 1-N may thereafter be appended to a second portion 202 of the memory capacity of the control blocks to provide a running record of the evaluation processing.

Figure 13:
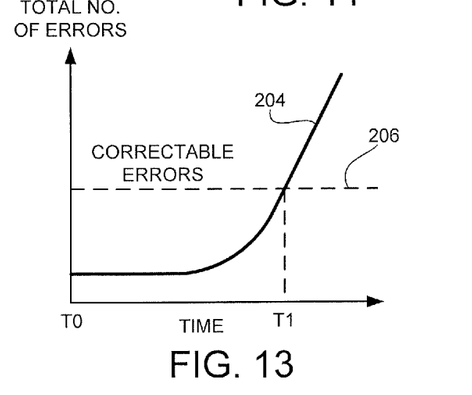
FIG. 13 is an error curve depicting an increase in read errors over time.

FIG. 13 is a graphical depiction of an error curve 204 plotted against an elapsed time x-axis and a total number of errors y-axis. The error curve 204 represents the numbers of detected errors in the readback test data portions from the sequence of FIG. 11. The curve may take any of a number of different shapes, including linear, exponential, geometric, etc. It is contemplated that initially, the total number of errors will be low (e.g., substantially zero) but over time, a gradual or sudden increase in errors will be observed. Cells that are sensitive to read disturb, for example, will likely see asymptotic increases in data errors as more cumulative read operations are carried out upon the memory cells.

Threshold line 206 depicts a predetermined threshold of errors, such as a total number of correctable errors in the readback pattern. This may represent, for example, the total error correction capability of a selected ECC scheme (e.g., Reed Solomon, BCH, etc.).

It may also represent the total number of expected errors that could likely be corrected using a probabilistic error correction routine, such as low density parity check (LDPC) processing, and an associated number of iterations (e.g., 10, etc.).

In some embodiments, once the curve 204 for a given set of control blocks 152 reaches the threshold 206, the testing ends and the time interval (time T0 to time T1) is used to identify the current retention time/rate. For reference, retention time (rate) is an elapsed time period over which the memory cells will retain data until a selected number of errors is experienced. A final data retention time/rate based on a period of time during which the system is not powered can be extrapolated from the measured retention rate.

Figure 14:
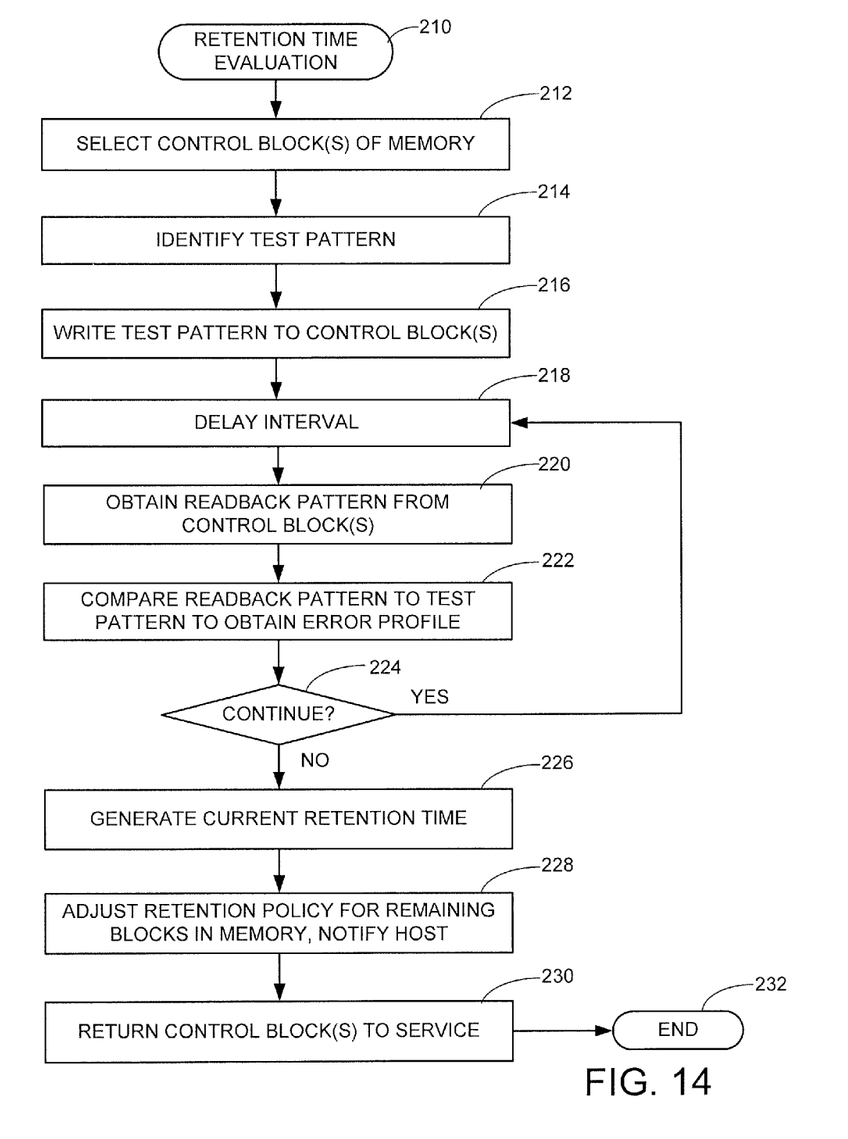
FIG. 14 is a flow chart for an evaluation routine in accordance with some embodiments.

FIG. 14 is a flow chart for a RETENTION TIME EVALUATION routine 210 in accordance with some embodiments. It is contemplated albeit not required that the routine is carried out by the device 100 of FIG. 2 including the evaluation circuit 150 of FIG. 7. The steps set forth in FIG. 14 may be altered, omitted and/or carried out in a different order.

The routine begins responsive to a command to initiate retention time evaluation, which may be generated automatically by the device or responsive to a host input. Control blocks (such as 152) for the evaluation test are selected at step 212, and a test pattern for storage in the control blocks is identified at step 214.

The test pattern is written to the control blocks at step 216, and a delay interval is imitated at step 218. As noted above, the delay can be any suitable value. In some embodiments, a highly accelerated test process is applied so that the delay is relatively short and repeated read operations are carried out upon the control blocks. In other embodiments, the delay is set to some suitable interval, such as once a day, etc.

In still other embodiments, the current workload is examined to get an understanding of an average read rate/memory cell, and a read schedule is applied to match the ongoing read level. Thus, if the host enters a read dominated mode of operation, a larger number of read operations will be carried out, and if the host enters a write dominated mode of operation, fewer read operations will be carried out. This provides an advantage of basing the reported retention rate on then-existing workload characteristics.

Once the indicated delay interval is completed, the routine continues at step 220 where a readback pattern is obtained from the selected control blocks. The readback pattern is evaluated for errors at step 222, such as by comparing the readback pattern with the original pattern to obtain an error profile. Alternatively, ECC processing can be applied to the readback pattern to identify selected numbers of detected and corrected errors.

A decision is made at step 224 whether to continue processing. One basis for continuing processing can be that the total number of detected errors is less than a selected threshold (see e.g., threshold 206 in FIG. 13). Another basis for continuing processing is a test profile based on a selected time period (e.g., 30 days regardless of the total number of reported errors, etc.). Thus, the routine returns to step 218 to continue periodic evaluation of the control blocks.

Once the processing is concluded, the routine passes from step 224 to step 226 where a current retention time profile is generated. In some embodiments, the retention time profile is based on an estimate of how long data could be current stored in the device without the application of power to the device. This may be determined by correlating empirically the relation between data retention using repetitive powered on reads (and the associated read disturb effects) with a powered off environment. The retention time profile can be reported to a host device and can be used to adjust a retention policy for remaining blocks at step 228. This can include a determination that existing data should be garbage collected and rewritten to a new location prior to the expiration of the current retention time.

The selected control blocks used for the evaluation are returned to service at step 230, such as by providing the GCU back to the allocation pool. The routine then ends at step 232, although it will be appreciated that concurrent testing as set forth by the routine can be continuously carried out in different locations within the device.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
   partitioning solid-state non-volatile memory cells of a non-volatile memory device into a plurality of units each individually allocatable for storage of user data;
   allocating at least one of the plurality of units not storing user data as a control set;
   storing user data from a host device to a first unit;
   writing a test pattern to the control set;
   reading the test pattern from the control set and identifying a total number of read errors;
   determining a data retention time responsive to the total number of read errors and an elapsed time interval between the writing of the test pattern and the reading of the test pattern, the data retention time comprising an estimated time during which the memory device can store a set of data in a powered off condition and can successfully retrieve the data after being subsequently powered on;
   obtaining system parameters comprising one or more of a current temperature value, a time stamp, a date stamp, and a total number of detected errors;
   writing the parameters to the control set as a test log entry;
   refreshing the user data in the first unit responsive to the determined data retention time; and
   subsequently storing user data from the host device in the first unit.

2. The method of claim 1, further comprising communicating the determined data retention time to the host device.

3. The method of claim 1, further comprising subsequently performing the writing, reading and determining steps on the control set and using the data retention time obtained for the control set to refresh the user data stored in the first unit.

4. The method of claim 1, wherein the first unit and control set each comprise a garbage collection unit (GCU) comprising a plurality of erasure blocks of flash memory cells each of which are erased as a unit.

5. The method of claim 1, wherein the solid-state non-volatile memory cells comprises flash memory cells and each of the plurality of units comprises at least one erasure block of said flash memory cells.

6. The method of claim 1, wherein the total number of read errors is identified by applying an error correction code (ECC) to detect and correct at least one error in the readback data.

7. The method of claim 1, wherein the total number of read errors is identified by comparing the test pattern read back from the control set with an original copy of the test pattern.

8. The method of claim 1, wherein the refreshing data comprises identifying sets of user data stored in the array having a total storage time greater than or equal to the determined retention time, and copying the identified sets to a new location in the memory.

9. The method of claim 1, wherein the memory device is a solid-state drive (SSD) and the data retention time indicates an elapsed time during which applied external power can be removed from the SSD and, upon resumption of the applied external power, the SSD can retrieve the data from the memory cells.

10. The method of claim 1, wherein the data retention time is correlated to a specified temperature of the memory device.

11. An apparatus comprising:
an array of solid-state non-volatile memory cells arranged into addressable blocks;
a control circuit configured to direct storage of user data received from a host device to a first addressable block and to allocate at least one addressable block not storing user data as a control set;
an evaluation circuit configured to
write a test pattern to the control set, subsequently read the test pattern from the control set, identify a total number of read errors in the subsequently read test pattern, and determine a data retention time responsive to the total number of read errors and an elapsed time interval between the writing of the test pattern and the reading of the test pattern, the elapsed time interval comprising an elapsed duration of time of at least 30 minutes without an application of an intervening refresh operation to the memory cells during said interval;
obtain system parameters comprising one or more of a current temperature value, a time stamp, a date stamp, and a total number of detected errors; and
write the parameters to the control set as a test log entry;
the control circuit further configured to refresh the user data previously stored in the first addressable block responsive to the determined data retention time.

12. The apparatus of claim 11 characterized as a data storage device coupled to the host device, wherein the control circuit communicates the determined data retention time to the host device.

13. The apparatus of claim 11, wherein the evaluation circuit is further configured to subsequently write a second test pattern to the first addressable block, subsequently read the second test pattern from the first addressable block, identify a second total number of read errors in the subsequently read second test pattern, and determine a second data retention time responsive to the second total number of read errors and a second elapsed time interval between the writing of the test pattern and the reading of the test pattern, and wherein the control circuit is further configured to refresh the data previously stored in the second addressable block responsive to the second data retention time.

14. The apparatus of claim 11, wherein each addressable block comprises a garbage collection unit (GCU) comprising a plurality of erasure blocks of memory cells each of which are erased as a unit.

15. The apparatus of claim 11, wherein the solid-state non-volatile memory cells comprises flash memory cells and each of the first block and control set comprises at least one erasure block of said flash memory cells.

16. The apparatus of claim 11, wherein the total number of read errors is identified by applying an error correction code (ECC) to detect and correct at least one error in the readback data.

17. The apparatus of claim 11, wherein the total number of read errors is identified by comparing the test pattern read back from the control set with an original copy of the test pattern.

18. An apparatus comprising:
a flash memory array arranged into a plurality of garbage collection units (GCUs) erased and allocated as a unit;
a control circuit configured to direct storage of user data from a host device into a first GCU; and
an evaluation circuit which determines a current data retention time of the flash memory array by storing a test pattern in a second GCU during continued storage of the data in the first GCU and, at the conclusion of an elapsed time interval, identifies a total number of errors in a copy of the test pattern read back from the second GCU;
the control circuit further configured to obtain system parameters comprising one or more of a current temperature value, a time stamp, a date stamp, and a total number of detected errors;
write the parameters to the control set as a test log entry; and
communicate the current data retention time to a host device and to subsequently direct storage of user data from the host device to the second GCU.

19. The apparatus of claim 18, wherein the control circuit is further configured to direct a movement of a set of data from a first GCU to a third GCU of the flash memory array responsive to the set of data being stored in the first GCU for a period of time equal to or greater than the current data retention time.

20. The apparatus of claim 18, wherein the current data retention time comprises an elapsed period of time during which the flash memory array can store a set of data without an application of power to the array and return the set of data after being powered up at the conclusion of the elapsed period of time.

* * * * *